(12) United States Patent
Kagaya et al.

(10) Patent No.: US 8,385,748 B2
(45) Date of Patent: Feb. 26, 2013

(54) PRINTED CIRCUIT BOARD AND OPTICAL TRANSMISSION DEVICE

(75) Inventors: Osamu Kagaya, Tokyo (JP); Koyu Takahashi, Yokohama (JP); Taichi Kogure, Kamakura (JP)

(73) Assignee: Oclaro Japan, Inc., Kanagawa (JP)

( * ) Notice: Subject to any disclaimer, the term of this patent is extended or adjusted under 35 U.S.C. 154(b) by 513 days.

(21) Appl. No.: 12/618,861

(22) Filed: Nov. 16, 2009

(65) Prior Publication Data

US 2010/0124423 A1 May 20, 2010

(30) Foreign Application Priority Data

Nov. 17, 2008 (JP) ................................. 2008-293947

(51) Int. Cl.
*H04B 10/00* (2006.01)
(52) U.S. Cl. ........ 398/164; 398/135; 398/136; 398/183; 398/192; 398/193; 398/194; 398/158; 398/159; 398/154; 385/88; 385/89; 385/90; 385/92; 385/93
(58) Field of Classification Search ............ 398/182, 398/183, 186, 188, 192, 193, 194, 163, 164, 398/135, 136, 137, 138, 139, 158, 159, 154, 398/155; 385/88, 89, 90, 92, 93
See application file for complete search history.

(56) References Cited

U.S. PATENT DOCUMENTS

| | | | |
|---|---|---|---|
| 5,479,288 A | 12/1995 | Ishizuka et al. | |
| 6,262,495 B1 | 7/2001 | Yablonovitch et al. | |
| 6,297,965 B1 | 10/2001 | Sasaki et al. | |
| 2008/0056727 A1* | 3/2008 | Nishihara et al. | 398/155 |
| 2008/0095541 A1* | 4/2008 | Dallesasse | 398/191 |

FOREIGN PATENT DOCUMENTS

| | | |
|---|---|---|
| JP | 63-108664 U | 7/1988 |
| JP | 63-108666 U | 7/1988 |
| JP | 63-108668 U | 7/1988 |
| JP | 64-042601 U | 3/1989 |
| JP | 05-335617 | 12/1993 |
| JP | 2970660 | 8/1999 |
| JP | 2000-22287 | 1/2000 |
| JP | 2001-211047 | 8/2001 |
| JP | 3086133 U | 3/2002 |
| JP | 2002-510886 | 4/2002 |
| JP | 2003-124011 | 4/2003 |
| JP | 2003-324314 | 11/2003 |
| JP | 2006-121179 A * | 5/2006 |
| JP | 2006-314046 | 11/2006 |
| JP | 2006-314406 | 11/2006 |
| JP | 2008-022543 | 1/2008 |

* cited by examiner

*Primary Examiner* — Hanh Phan
(74) *Attorney, Agent, or Firm* — Antonelli, Terry, Stout & Kraus, LLP.

(57) ABSTRACT

To reduce emission of an unintentional electromagnetic wave even if a frequency of a clock signal being output is high, a printed circuit board (10) includes: a substrate (101); signal output circuits (102 and 103) formed on the substrate (101), for outputting a clock signal; power supply wirings (109 and 110) for connecting the signal output circuits (102 and 103) and a power source; and trap filters (107 and 108) provided to the power supply wirings (109 and 110), for attenuating a frequency component corresponding to a frequency of the clock signal.

9 Claims, 10 Drawing Sheets

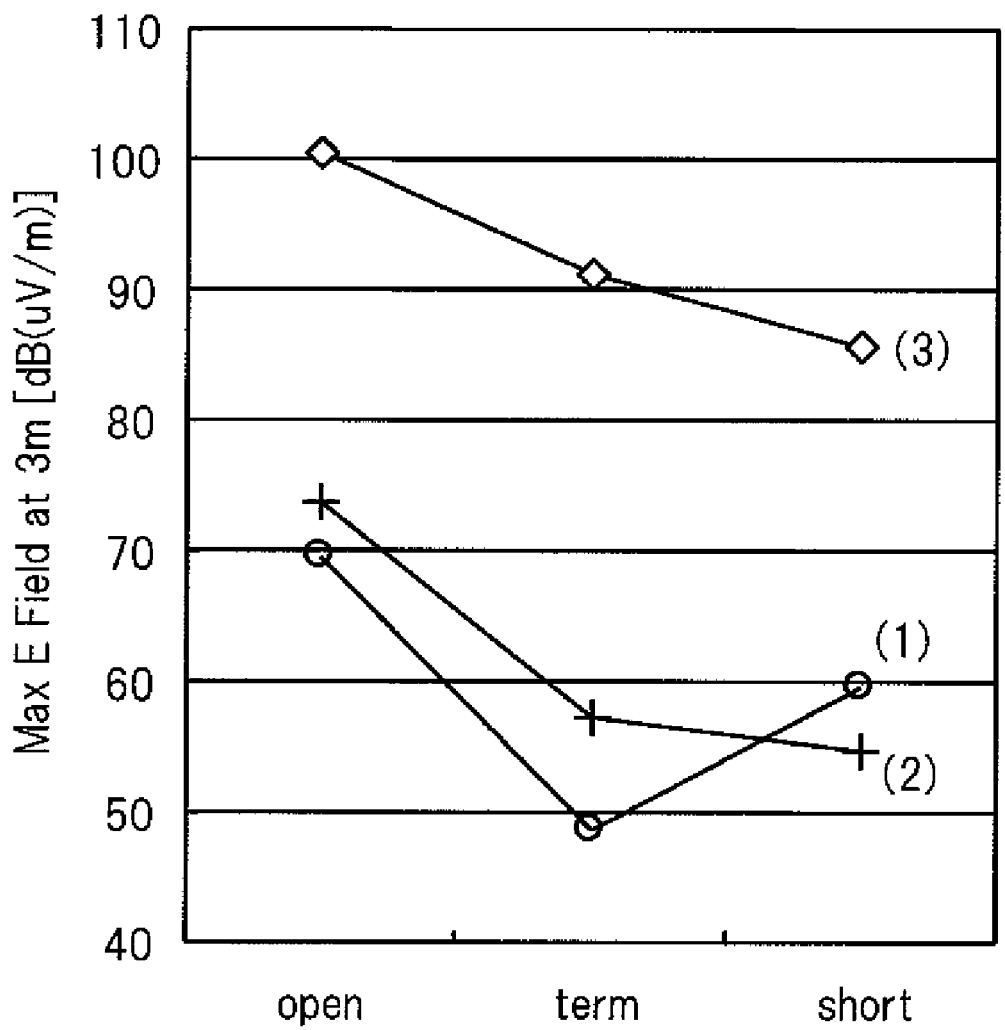

PRINTED CIRCUIT BOARD AND OPTICAL TRANSMISSION DEVICE

CROSS-REFERENCE TO RELATED APPLICATION

The present application claims priority from Japanese application JP2008-293947 filed on Nov. 17, 2008, the content of which is hereby incorporated by reference into this application.

BACKGROUND OF THE INVENTION

1. Field of the Invention

The present invention relates to a printed circuit board and an optical transmission device.

2. Description of the Related Art

There is a demand to reduce an intensity of an unintentional electromagnetic wave generated from an optical transmission device to lower than a predetermined value. As the optical transmission device has many electromagnetic waves radiated from a built-in IC, development of a technology for effectively reducing the electromagnetic waves radiated from the IC becomes important.

To cope with this, JP 2970660 B proposes a technology for reducing the radiation of an unintentional electromagnetic wave due to a switching noise from an IC through arrangement of two chip capacitors with an appropriate interval between a power supply terminal of the IC and a power supply circuit of a printed circuit board.

However, the above-mentioned conventional technology may appropriately reduce the unintentional electromagnetic wave in a frequency range of from approximately 30 MHz to 1 GHz, but may not obtain a sufficient effect of reducing a high-frequency noise component, which is generated when handling a signal having a high frequency of, for example, equal to or higher than 20 GHz, which is used in a case of performing transmission at a high bit rate. Possible reasons therefor include the following two factors.

As a first factor, it is thought that, due to series inductance involved in the two chip capacitors, lowering of its impedance becomes hard to attain. As a second factor, even if the impedance of the series inductance involved in the chip capacitors may ideally be lowered, a loop current may generate a large amount of unintentional electromagnetic radiation. Accurate calculation of the electromagnetic radiation necessitates a simulation using a three-dimensional electromagnetic field analysis tool, but the description is made herein for the sake of simplicity by using an equation for a maximum electric field intensity in a far field (Mardiguian, Michel; translated by Kobayashi, Takehiko; "Controlling Radiated Emissions by Design"; Page 27; Equation (2.20)) based on a simple geometric model expressed by Equation (1) described below:

$$E = (0.013 \cdot V \cdot A \cdot f_{MHz}^2)/D \cdot Z_c [V/m] \quad \text{Equation (1)}$$

where $f_{MHz}$ represents a frequency expressed in MHz, A represents an area of a loop drawn by a closed current path, V represents a voltage (at the frequency $f_{MHz}$) of an excitation source to be a noise, $Z_c$ represents a circuit impedance including an internal impedance of the excitation source, and D represents a distance from an observation position. As an example, it is assumed that: a current from the excitation source at the power supply terminal of the IC is 10 mA (that is, $V/Z_c=10$ mA); a short circuit is established by an ideal decoupling capacitor in a position 4.0 mm apart from the power supply terminal of the IC; a printed circuit board has a thickness of 0.25 mm (that is, $A=1.0$ mm$^2$) between a surface-layer wiring layer thereof and a ground wiring layer thereof; and there is no power supply wiring in an outside of the decoupling capacitor (that is, there is no propagation of a noise due to conduction through a power supply wiring and no noise radiation thereafter). When the maximum electric field intensity observed in the three-meter distant position in this case is calculated by Equation (1) described above, 33 dB($\mu$V/m) is obtained in a case of the frequency of 1 GHz, while in a case where the frequency becomes as high as, for example, 20 GHz, the maximum electric field intensity is increased to 85 dB ($\mu$V/m), which is 400 times as high as 33 dB (that is, +52 dB). This indicates that even if the above-mentioned conventional technology producing effects in a frequency range of equal to or lower than 1 GHz is made to be ideal, the unintentional electromagnetic wave that is intense may be radiated with ease at the frequency of 20 GHz.

SUMMARY OF THE INVENTION

It is one object of the present invention to provide a printed circuit board and an optical transmission device, which are capable of reducing emission of an unintentional electromagnetic wave even if a frequency of a clock signal being output becomes high.

In order to achieve the above-mentioned object, according to the present invention, there is provided a printed circuit board including: a substrate; a signal output circuit formed on the substrate, for outputting a clock signal; a shield for covering the signal output circuit; a power supply wiring for connecting the signal output circuit and a power source; and a trap filter provided to the power supply wiring, for attenuating a frequency component corresponding to a frequency of the clock signal, in which the trap filter is provided inside the shield. With this structure, it is possible to suppress propagation of a switching noise of a frequency component corresponding to the clock signal.

According to an aspect of the present invention, the trap filter includes a resonance circuit including: one portion of the power supply wiring; an inner-layer wiring of the substrate located below the one portion of the power supply wiring; an inner-layer ground wiring of the substrate located below the inner-layer wiring; and a via hole for connecting the inner-layer wiring and the inner-layer ground wiring. With this structure, it is possible to realize a trap filter for attenuating a switching noise with a simple structure.

According to another aspect of the present invention, a plurality of the trap filters are provided to the power supply wiring. By thus using the plurality of the trap filters, it is possible to attenuate a switching noise more effectively than in a case of using one trap filter.

According to still another aspect of the present invention, the plurality of the trap filters have a distance between respective via holes thereof set to equal to or less than ¼ a wavelength of the clock signal. With this structure, it is possible to effectively attenuate a noise having a wavelength of the clock signal.

According to a further aspect of the present invention, the plurality of the trap filters have a distance between respective via holes thereof set to equal to or less than 0.3 mm. With this structure, it is possible to effectively attenuate a noise due to the clock signal at a clock frequency of equal to or higher than 20 GHz.

According to a further aspect of the present invention, the plurality of the trap filters have mutually different frequency components to be attenuated. With this structure, it is possible to attenuate a noise within a frequency band including the frequency of the clock signal.

According to a further aspect of the present invention, the signal output circuit includes: an oscillator circuit for oscillating a clock signal; and an amplifier circuit for amplifying the clock signal oscillated by the oscillator circuit, and the trap filter is provided to the power supply wiring for each of the oscillator circuit and the amplifier circuit. With this structure, it is possible to suppress transfer of a noise from each circuit that generates a switching noise.

According to a further aspect of the present invention, the above-mentioned printed circuit board further includes a capacitor provided to the power supply wiring. With this structure, it is possible to reduce a noise of a frequency lower than the frequency of the clock signal by the capacitor.

According to a further aspect of the present invention, there is provided an optical transmission device including: a substrate; a signal output circuit formed on the substrate, for outputting a clock signal; a shield for covering the signal output circuit; a power supply wiring for connecting the signal output circuit and a power source; a trap filter provided to the power supply wiring, for attenuating a frequency component corresponding to a frequency of the clock signal; and an optical transmitting section for receiving the clock signal output by the signal output circuit, modulating an optical signal, and transmitting the optical signal, in which the trap filter is provided inside the shield. With this structure, it is possible to suppress propagation of a switching noise corresponding to the frequency component of the clock signal, and therefore reduce a noise superimposed on an optical signal being transmitted.

BRIEF DESCRIPTION OF THE DRAWINGS

In the accompanying drawings:

FIG. 13 is a graph illustrating changes of the unintentional electromagnetic wave intensities in the case where the tip impedance of the power supply wiring is caused to change.

DETAILED DESCRIPTION OF THE INVENTION

Hereinafter, the accompanying drawings are used to describe a preferred embodiment for implementing the present invention (hereinafter, referred to simply as "embodiment").

Figure 1:
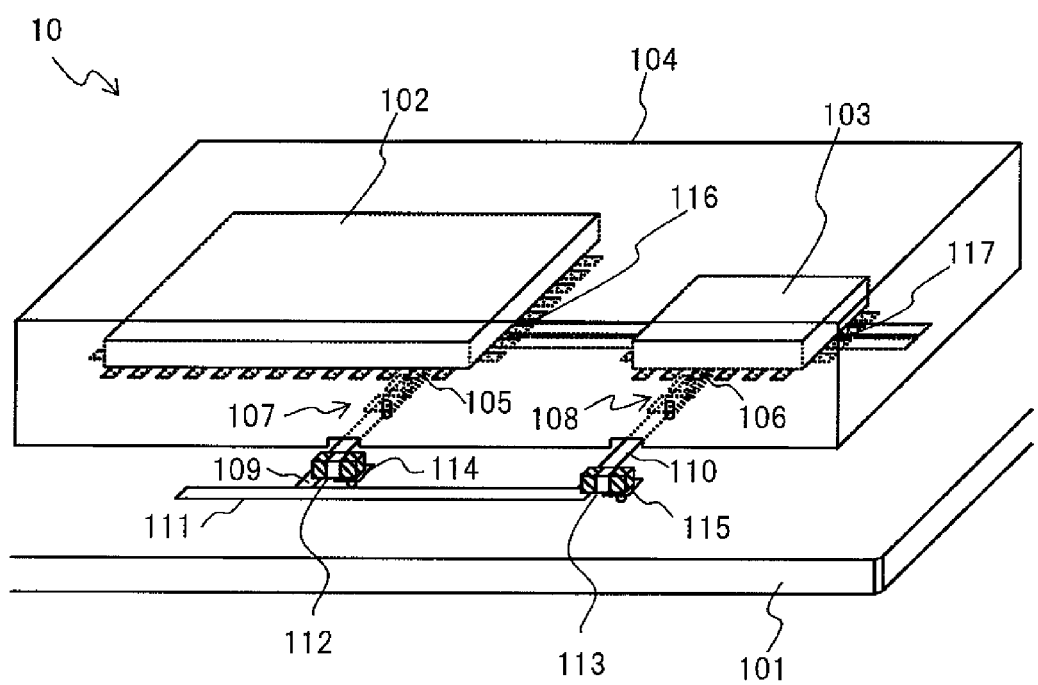
FIG. 1 is a structural diagram of a printed circuit board according to an embodiment of the present invention.

FIG. 1 is a structural diagram illustrating a printed circuit board 10 according to this embodiment. The printed circuit board 10 constitutes a part of a transmitting circuit of an optical transmitter/receiver device. A multiplexer IC 102 having a clock outputting function and a driver IC 103 that drives an optical modulator for return-to-zero (RZ) modulation by amplifying a clock signal output from the multiplexer IC 102 are formed on a substrate 101 of the printed circuit board 10, and are both covered with a shield plate 104. The multiplexer IC 102 and the driver IC 103 include power supply terminals 105 and 106, respectively, which are connected to a power supply pad on the substrate 101. In addition, trap filters 107 and 108 each constructed of a resonance circuit are located midway in power supply wirings 109 and 110, respectively, which extend on the substrate 101. In this embodiment, the trap filters 107 and 108 are both located inside the shield plate 104. As decoupling capacitors, chip capacitors 112 and 113 are shunt-connected to the power supply wirings 109 and 110, respectively, and have one ends connected to a ground wiring layer inside the substrate 101 through ground connection pads 114 and 115 and via holes, respectively. Further provided are clock output terminals 116 and driver output terminals 117.

In this embodiment, a clock frequency of the clock signal output by the multiplexer IC 102 and the driver IC 103 is set to 21.5 GHz. A conductive material such as a metal plate formed by, for example, sheet metal working may be used for the shield plate 104. The shield plate 104 has an electric potential set to a ground potential, and is connected to the ground wiring layer inside the substrate 101. The chip capacitors 112 and 113 each have a capacitance value of, for example, 0.1 µF, and reduce an impedance of a power supply wiring in a low frequency domain (1 GHz or less). The chip capacitors 112 and 113 may be located midway between the power supply pads of the multiplexer IC 102 and the driver IC 103 and portions at which a common power supply wiring 111 branches to the power supply wirings 109 and 110, respectively, and may be located inside the shield plate 104.

Hereinafter, first to fifth embodiments are described as specific structures of the trap filters 107 and 108 provided to the power supply wirings 109 and 110, respectively. The first to third embodiments relate to trap filters constructed as resonance circuits of an LC resonance type, and the fourth and fifth embodiments relate to trap filters constructed as resonance circuits of an open stub type.

Figure 2A:
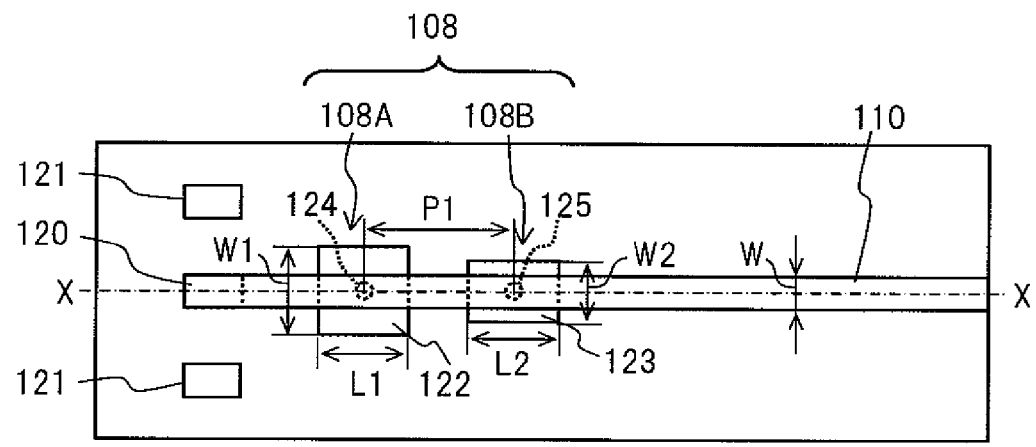
FIG. 2A is a plan view of a substrate in which a trap filter according to a first embodiment of the present invention is formed.
Figure 2B:
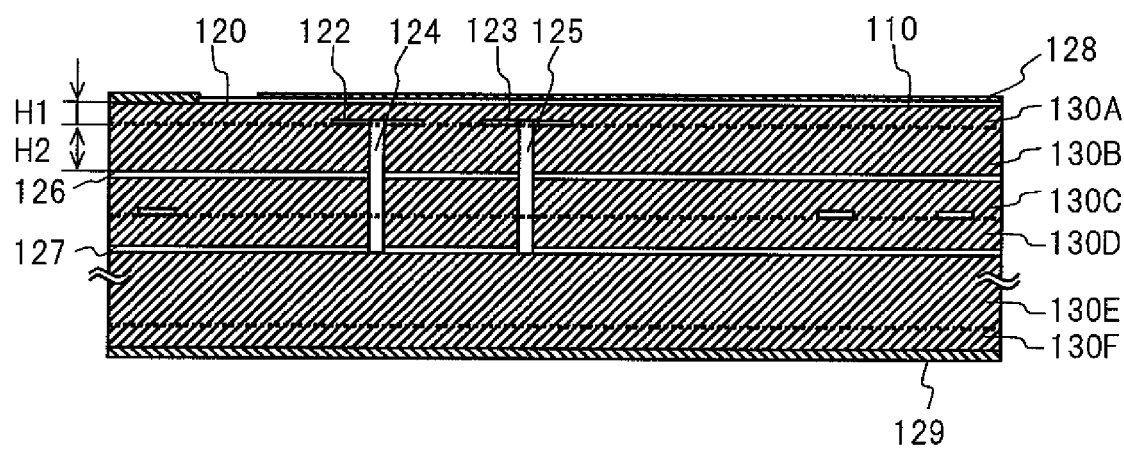
FIG. 2B is a cross-sectional view of the substrate in which the trap filter according to the first embodiment is formed.

First, FIGS. 2A and 2B are structural diagrams illustrating the trap filter according to the first embodiment. FIGS. 2A and 2B illustrate only the structure of the trap filter 108, but the trap filter 107 has the same structure. FIG. 2A illustrates a part of the substrate 101 in which the trap filter 108 is formed, which is viewed from above, and FIG. 2B is a cross-sectional view thereof along the line X-X of FIG. 2A.

As illustrated in FIGS. 2A and 2B, the trap filter 108 includes two resonance circuits arranged in series in the power supply wiring 110. A first resonance circuit 108A includes one region of the power supply wiring 110 formed of a surface-layer wiring provided to a surface of the substrate 101, a minute isolated pattern 122 formed of a first inner-layer wiring located below the one region, and a via hole 124 that connects the minute isolated pattern 122 and a ground wiring layer 126 formed of a second inner-layer wiring.

A second resonance circuit 108B includes one region of the power supply wiring 110 formed of the surface-layer wiring, a minute isolated pattern 123 formed of the first inner-layer wiring located below the one region, and a via hole 125 that connects the minute isolated pattern 123 and the ground wiring layer 126 formed of the second inner-layer wiring. A power supply pad 120 is connected to the power supply terminal 106 of the driver IC 103. Pads 121 connect adjacent IC terminals. Further provided are a ground wiring layer 127, solder resists 128 and 129, and dielectric layers 130A to 130F. Here, a center frequency of the trap filter 108 is set to the vicinity of 21.5 GHz, which is the clock signal frequency. Hereinafter, description is made of a specific example of the structure.

First, a material formed of a glass fabric base and an epoxy resin is used for the dielectric layers 130A to 130F, and a dielectric constant thereof is set to 3.6. The dielectric layer 130A is formed to have a thickness H1 of 60 μm, while the dielectric layer 130B is formed to have a thickness H2 of 200 μm, and a copper foil is used for a wiring pattern. The power supply wiring 110 is formed to have a width W of 0.5 mm. Shapes of the minute isolated patterns 122 and 123 are both set to a rectangle, and sizes thereof are set to be different from each other. The minute isolated pattern 122 is formed to have a width W1 of 1.5 mm, while the minute isolated pattern 123 is formed to have a width W2 of 1.0 mm, and the widths W1 and W2 are both set to be larger than the width of the power supply wiring 110. A length L1 of the minute isolated pattern 122 and a length L2 of the minute isolated pattern 123 are both set to 1.5 mm. The via holes 124 and 125 are formed by copper plating.

The via holes 124 and 125 are each formed to have a diameter of 0.2 mm, and are located in central positions of the minute isolated patterns 122 and 123, respectively. The first resonance circuit 108A and the second resonance circuit 108B are arranged such that an interval (via pitch) P1 between central positions of the via holes 124 and 125 is, for example, 2.25 mm. The via pitch P1 is selected so as to be 90°, that is, ¼ a wavelength at the frequency of 21.5 GHz in terms of an electrical length of the power supply wiring 110.

By forming the minute isolated patterns 122 and 123 to have the rectangular shapes and the widths larger than the width of the power supply wiring, it is possible to inhibit characteristics of the resonance circuits from fluctuating due to deviation of the pattern of the first inner-layer wiring from the surface-layer wiring. In FIGS. 2A and 2B, the via holes 124 and 125 are illustrated as inner via holes obtained by performing drilling with a drill reaching from the minute isolated patterns 122 and 123 up to the ground wiring layer 127, but may be formed as laser via holes reaching up to the ground wiring layer 126.

Naturally, the present invention is not limited to the above-mentioned material characteristics, widths, pattern sizes, and the like, and other numerical values designed by using a three-dimensional electromagnetic field analysis tool or the like may be used so that desired characteristics are exhibited.

Figure 3A:
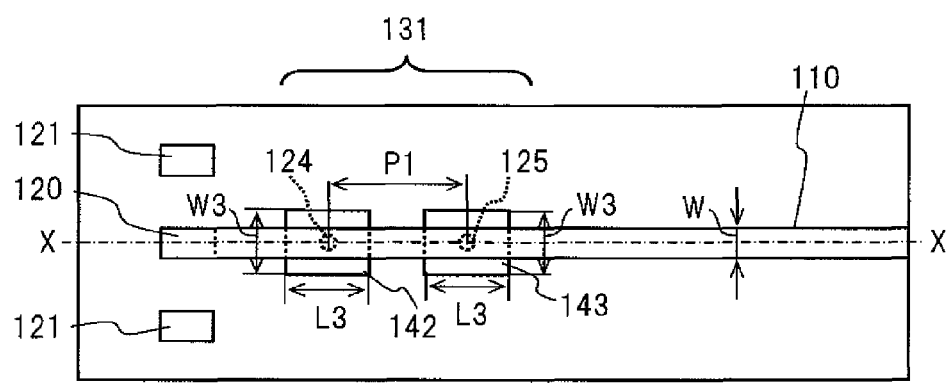
FIG. 3A is a plan view of a substrate in which a trap filter according to a second embodiment of the present invention is formed.
Figure 3B:
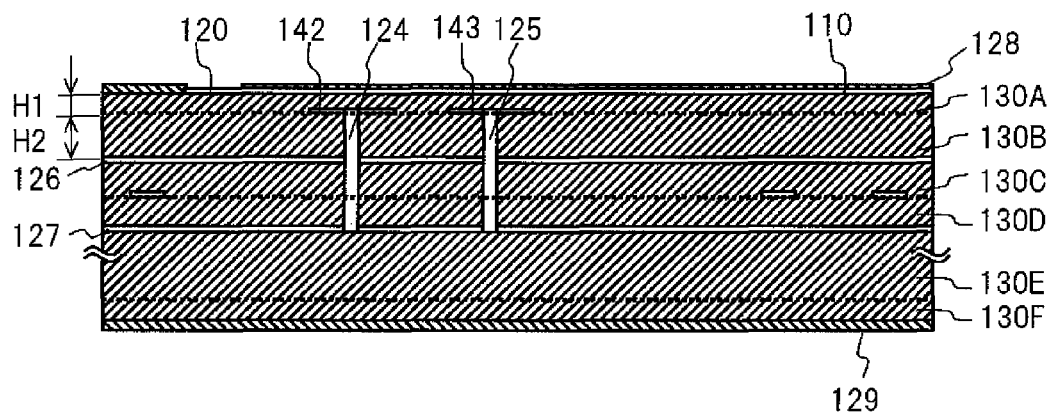
FIG. 3B is a sectional view of the substrate in which the trap filter according to the second embodiment is formed.

Next, description is made of the trap filter according to the second embodiment. FIGS. 3A and 3B are structural diagrams illustrating a trap filter 131 according to the second embodiment. FIG. 3A illustrates a part of the substrate 101 in which the trap filter 131 is formed, which is viewed from above, and FIG. 3B is a cross-sectional view thereof along the line X-X of FIG. 3A. As illustrated in FIGS. 3A and 3B, the trap filter 131 according to the second embodiment and the trap filter 108 according to the first embodiment differ in that the trap filter 131 is constructed by using two resonance circuits having the same shape, that is, having the same resonance frequency in the second embodiment. In other respects, the second embodiment is the same as the first embodiment. In FIGS. 3A and 3B, minute isolated patterns 142 and 143 are set to have a width W3 of 1.25 mm and a length L3 of 1.5 mm.

Figure 4A:
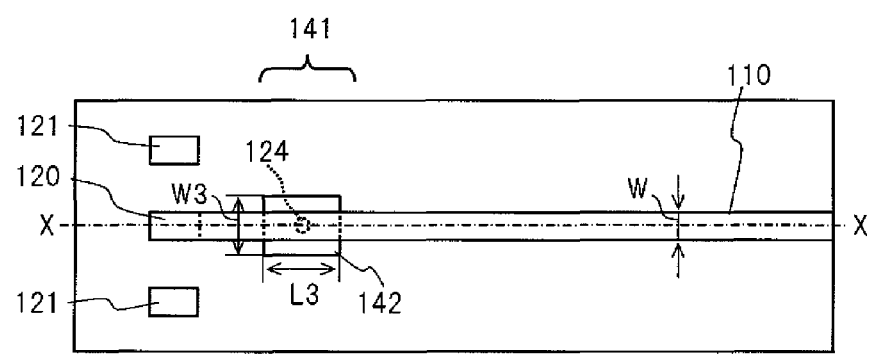
FIG. 4A is a plan view of a substrate in which a trap filter according to a third embodiment of the present invention is formed.
Figure 4B:
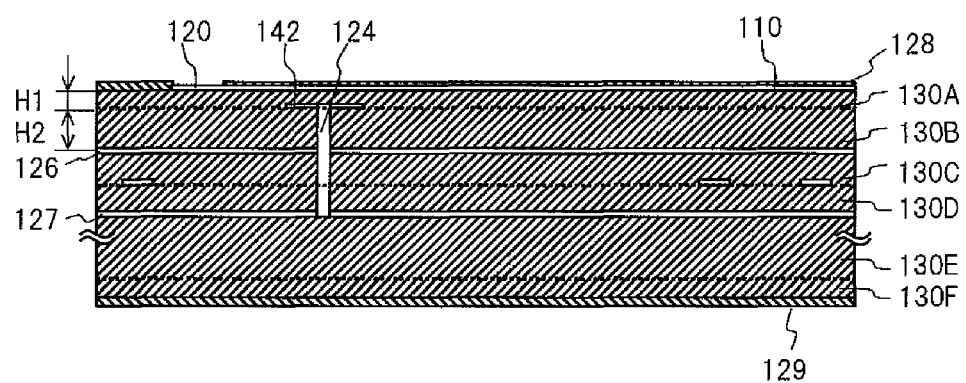
FIG. 4B is a sectional view of the substrate in which the trap filter according to the third embodiment is formed.

Next, description is made of the trap filter according to the third embodiment. FIGS. 4A and 4B are structural diagrams illustrating a trap filter 141 according to the third embodiment. FIG. 4A illustrates a part of the substrate 101 in which the trap filter 141 is formed, which is viewed from above, and FIG. 4B is a cross-sectional view thereof along the line X-X of FIG. 4A. As illustrated in FIGS. 4A and 4B, the trap filter 141 according to the third embodiment and the trap filter 108 according to the second embodiment differ in that the trap filter 141 is constructed by using one resonance circuit in the third embodiment. In other respects, the third embodiment is the same as the second embodiment. In FIGS. 4A and 4B, the minute isolated pattern 142 is set to have the width W3 of 1.25 mm and the length L3 of 1.5 mm.

Figure 5:
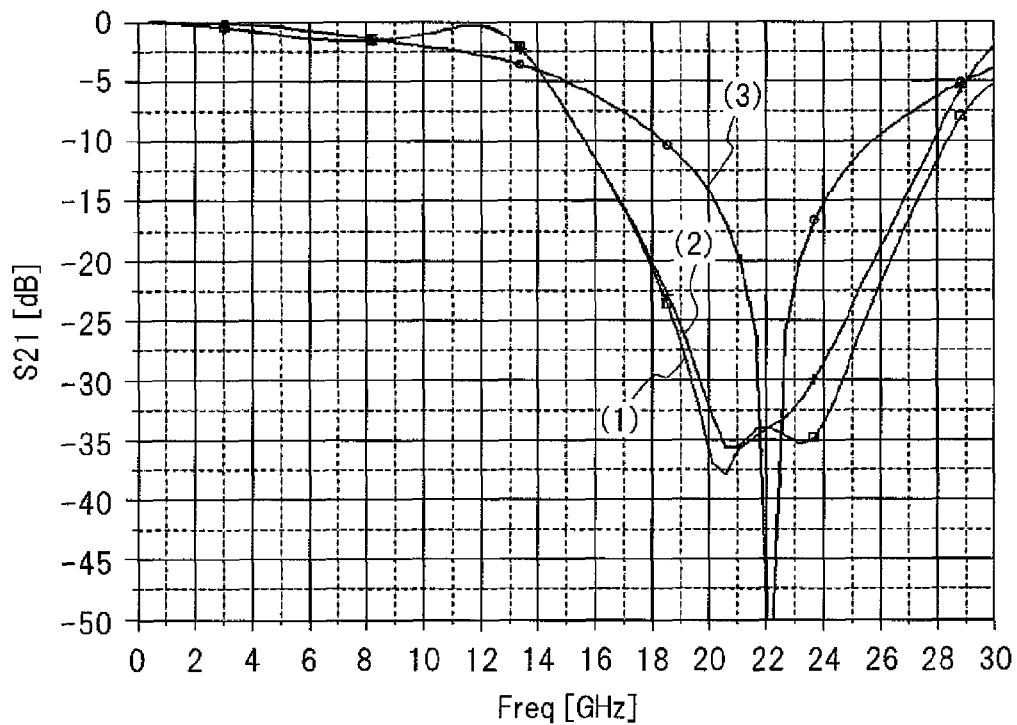
FIG. 5 is a graph illustrating small signal filter characteristics (S21) of the trap filters.

Next, by referring to FIG. 5, description is made of small signal filter characteristics (S21) of the trap filters according to the first to third embodiments. The small signal filter characteristics of the respective trap filters illustrated in FIG. are results obtained by using the three-dimensional electromagnetic field analysis tool in a case where 50-Ω ports are located at both ends of the power supply wiring 110 provided with the trap filter. Note that regions of the power supply wiring 110 other than the trap filter are set to form a microstrip line having a characteristic impedance of 50Ω, and the small signal filter characteristics illustrated in FIG. 5 substantially reflect the characteristics of the trap filters per se. In FIG. 5, the line (1) represents the characteristic of the trap filter according to the first embodiment, the line (2) represents the characteristic of the trap filter according to the second embodiment, and the line (3) represents the characteristic of the trap filter according to the third embodiment.

As illustrated in FIG. 5, the trap filter 108 according to the first embodiment is given a difference between the sizes of the two resonance circuits to obtain the small signal filter characteristic exhibiting two valleys at 20.6 GHz and 23.4 GHz, and the center frequency is approximately 22 GHz. A trap band thereof corresponds to a domain ranging from the frequency of 19.2 GHz to the frequency of 24.6 GHz if defined as a domain of an attenuation of equal to or larger than 30 dB, which may realize a bandwidth of as large as 5.4 GHz, being a relatively large value.

Next, the trap filter 131 according to the second embodiment has the characteristic exhibiting a valley at the center frequency ranging from 21 GHz to 22 GHz. A trap band thereof corresponds to a domain ranging from the frequency of 19.7 GHz to the frequency of 23.7 GHz if defined as the domain of the attenuation of equal to or larger than 30 dB, which may realize a bandwidth of as large as 4 GHz but not so large as the value of the first embodiment, still being a relatively large value.

Further, the trap filter 141 according to the third embodiment has the characteristic exhibiting a sharp valley at the center frequency of 22 GHz. A trap band thereof corresponds to a domain ranging from the frequency of 21.7 GHz to the frequency of 22.6 GHz if defined as the domain of the attenuation of equal to or larger than 30 dB. A bandwidth thereof is 0.9 GHz, being narrower than those of the first embodiment and the second embodiment.

Figure 6:
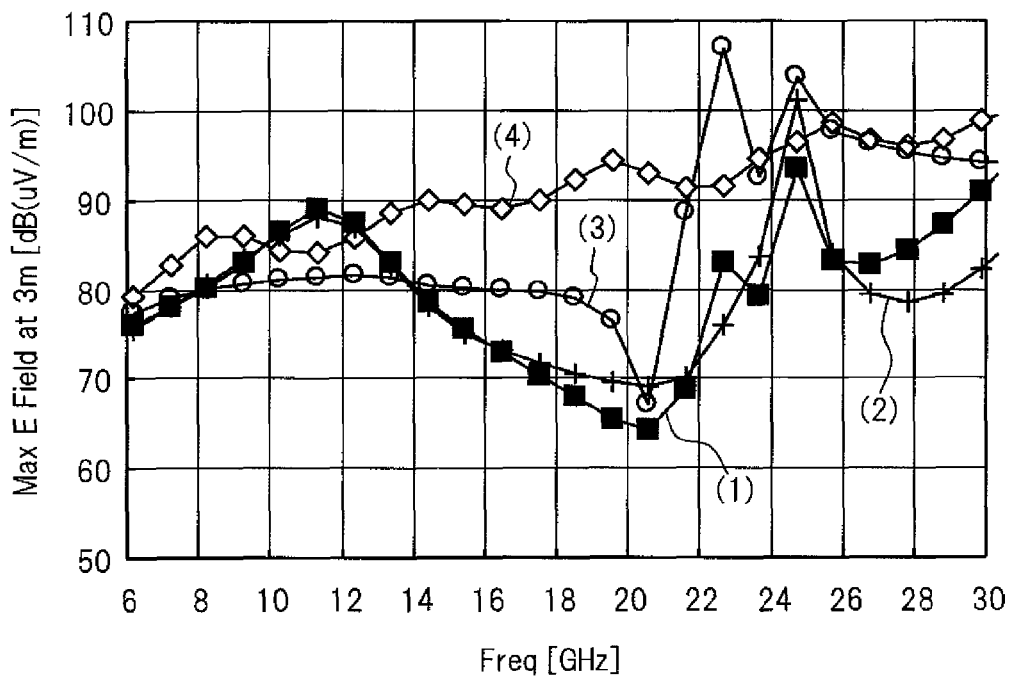
FIG. 6 is a graph representing relationships between frequencies and maximum electric field intensities of an unintentional electromagnetic wave.
Figure 7:
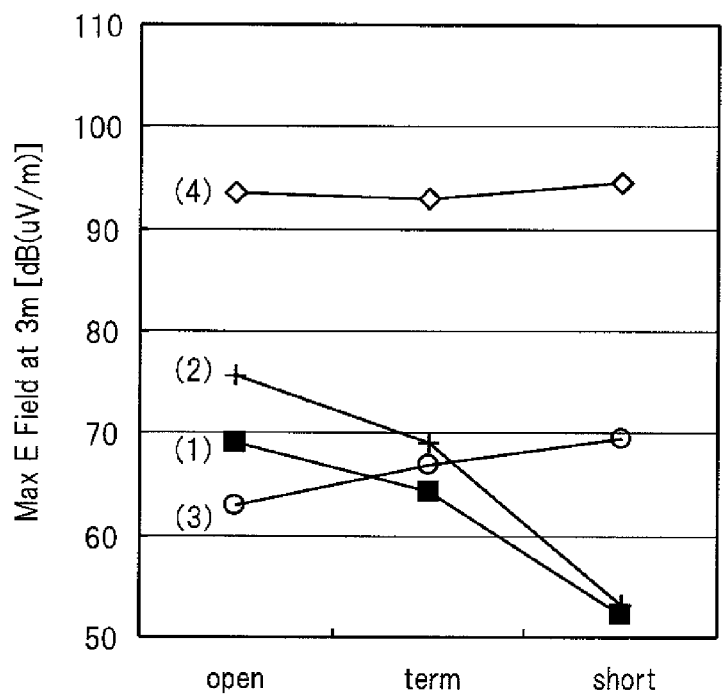
FIG. 7 is a graph illustrating changes of the unintentional electromagnetic wave intensities in a case where a tip impedance of a power supply wiring is caused to change.
Figure 8:
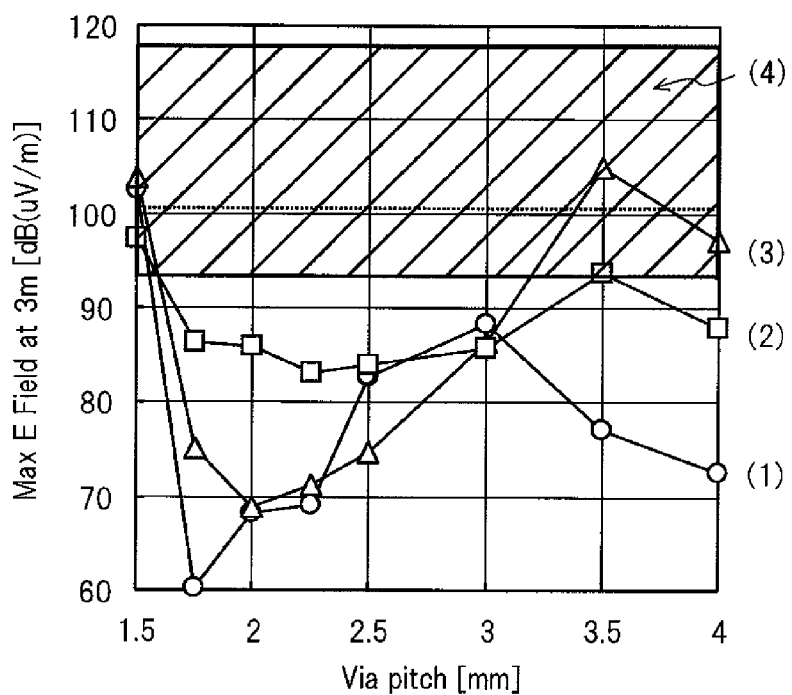
FIG. 8 is a graph illustrating the maximum electric field intensities of the unintentional electromagnetic wave in a case where a via pitch is caused to change.

Next, by referring to FIGS. 6 to 8, description is made of effects of reducing an unintentional electromagnetic wave by using the trap filters according to the first to third embodiments. The graphs illustrated in FIGS. 6 to 8 are simulation results by using the three-dimensional electromagnetic field analysis tool, and simulations are performed on the printed circuit board 10 illustrated in FIG. 1 for the sake of simplicity by assuming one of the driver output terminals 117 to be the only noise source and assuming the power supply wiring 110 to have a shape extending out of the shield plate 104 by a length of 10 mm with no further portion existing. An excitation source is located in the position of the driver output terminal 117, and has an excitation current value set to 10 mA at all of frequencies.

FIG. 6 illustrates a graph with the horizontal axis being a frequency axis and the vertical axis indicating a maximum electric field intensity of an unintentional electromagnetic wave at a distance of 3 m. In FIG. 6, the line (1) represents the first embodiment, the line (2) represents the second embodiment, the line (3) represents the third embodiment, and the line (4) represents a conventional technology provided with no trap filter. Note that the impedance at a tip of the power supply wiring 110 is terminated at 50Ω (term) as an example.

As illustrated in FIG. 6, the line (4) of the conventional technology provided with no trap filter indicates that the maximum electric field intensity is equal to or larger than 90 dB (μV/m) in a frequency range from the frequency of 17.5 GHz to the frequency of 21.8 GHz, while the line (1) of the first embodiment indicates that the maximum electric field intensity of the unintentional electromagnetic wave is reduced to equal to or smaller than 70 dB (μV/m) in the same frequency range. In other words, FIG. 6 indicates that a printed circuit board including the trap filter according to the first embodiment produces an effect of such a great improvement that the unintentional electromagnetic wave is cut by equal to or larger than 20 dB in the domain of a frequency bandwidth of 4.3 GHz including the clock signal frequency of 21.5 GHz. In addition, in the case of the first embodiment, the highest effect of reducing the unintentional electromagnetic wave is obtained at 20.6 GHz, which is a frequency slightly lower than the center frequency of 22 GHz of the trap filter 108, and the maximum reduction effect of 28 dB is obtained.

Next, as illustrated in FIG. 6, the line (4) of the conventional technology provided with no trap filter indicates that the maximum electric field intensity is equal to or larger than 90 dB (μV/m) in a frequency range from the frequency of 19 GHz to the frequency of 21.6 GHz, while the line (2) of the second embodiment indicates that the maximum electric field intensity of the unintentional electromagnetic wave is successfully reduced to equal to or smaller than 70 dB (μV/m) in the same frequency range. In other words, FIG. 6 indicates that the second embodiment produces an effect of such a great improvement that the unintentional electromagnetic wave is cut by equal to or larger than 20 dB in the domain of a frequency bandwidth of 2.6 GHz including the clock signal frequency of 21.5 GHz.

Further, as illustrated in FIG. 6, the line (3) of the third embodiment indicates that the maximum electric field intensity of the unintentional electromagnetic wave is successfully reduced to equal to or smaller than 70 dB (μV/m) at the frequency of 20.6 GHz.

The impedance at a tip of the power supply wiring 110 may vary from 0Ω (short: short-circuited) to infinity (open: open-circuited) depending on a circuit layout or a frequency, and the unintentional electromagnetic wave needs to be reduced in all of the cases. Therefore, FIG. 7 illustrates changes of the unintentional electromagnetic wave intensities in a case where a tip impedance of the power supply wiring 110 is caused to change at the frequency of 20.6 GHz at which the maximum reduction effects are obtained in FIG. 6. In FIG. 7, the line (1) represents the first embodiment, the line (2) represents the second embodiment, the line (3) represents the third embodiment, and the line (4) represents the conventional technology provided with no trap filter.

As illustrated in FIG. 7, the line (1) of the first embodiment indicates that even if the tip impedance of the power supply wiring 110 is caused to change, such a high effect is obtained that the effect of reducing the unintentional electromagnetic wave is equal to or larger than 22 dB, which is larger than in the line (4) of the conventional technology. In addition, line (2) of the second embodiment also indicates that such a relatively high effect is obtained that the effect of reducing the unintentional electromagnetic wave is equal to or larger than 19 dB, which is larger than in the line (4) of the conventional technology. Further, the line (3) of the third embodiment also indicates that such a high effect is obtained that the effect of reducing the unintentional electromagnetic wave is equal to or larger than 24 dB, which is larger than in the line (4) of the conventional technology.

Note that, for example, the via pitch P1 is set to 2.25 mm in the trap filter 108 according to the first embodiment, but it is possible to obtain the effect of reducing the unintentional electromagnetic wave even if the above-mentioned value changes to some extent. Therefore, FIG. 8 indicates the maximum electric field intensities of the unintentional electromagnetic wave which are calculated in a case where the via pitch P1 is caused to change in a range from 1.5 mm to 4 mm. In FIG. 8, the lines (1), (2), and (3) represent 20.6 GHz, 21.6 GHz, and 22.7 GHz, respectively, and the area (4) represents a range of values of the maximum electric field intensity of the unintentional electromagnetic wave at 20.6 GHz to 22.7 GHz according to the conventional technology.

As illustrated in FIG. 8, in the range from the frequency of 20.6 GHz to the frequency of 22.6 GHz, which includes the clock signal frequency of 21.5 GHz, the effect of reducing the unintentional electromagnetic wave is obtained in a case where a via pitch is equal to or smaller than 3 mm rather than in the conventional technology. Note that in the case where the via pitch is 1.5 mm, the effect of reducing the unintentional electromagnetic wave is lost because the minute isolated patterns 122 and 123 are connected to each other.

As described above, by providing the power supply wirings with the trap filters according to the first to third embodiments, it is possible to obtain a printed circuit board that suppresses the radiation of the unintentional electromagnetic wave generated from the power supply terminal of the IC including a clock output terminal or the IC for amplifying the clock signal without increasing a cost thereof, and it is possible to realize an optical transmitter/receiver device and an optical transmission device in which the reduction of the unintentional electromagnetic wave is compatible with the reduced cost. Further, according to the first to third embodiments, the trap filter having the center frequency in the vicinity of 20 GHz may be built into a printed circuit board with the width of 1.5 mm, which is an extremely small size, and it is possible to realize the trap filter suitable for downsizing the optical transmitter/receiver device and the optical transmission device.

Next described are the trap filters constructed as the resonance circuits of the open stub type according to the fourth and fifth embodiments. The trap filters according to the fourth and fifth embodiments are also provided to the power supply wirings 109 and 110 illustrated in FIG. 1. Hereinafter, the description is directed to only the trap filter provided to the power supply wiring 110, but the trap filter provided to the power supply wiring 109 has the same structure.

Figure 9A:
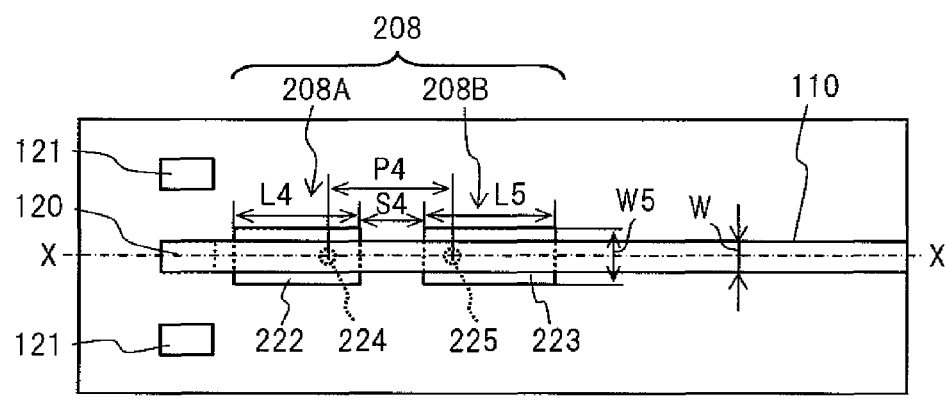
FIG. 9A is a plan view of a substrate in which a trap filter according to a fourth embodiment of the present invention is formed.
Figure 9B:
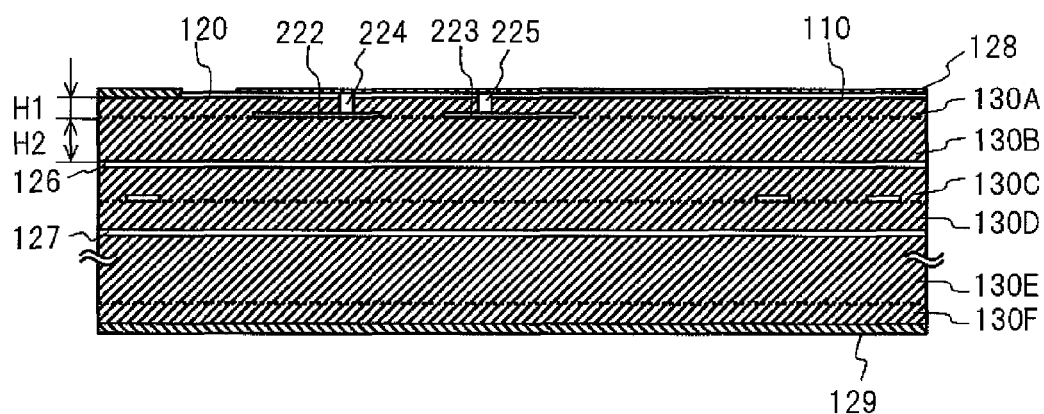
FIG. 9B is a sectional view of the substrate in which the trap filter according to the fourth embodiment is formed.

FIGS. 9A and 9B are structural diagrams illustrating a trap filter 208 according to the fourth embodiment. FIG. 9A illustrates a part of the substrate 101 in which the trap filter 208 is formed, which is viewed from above, and FIG. 9B is a cross-sectional view thereof along the line X-X of FIG. 9A. As illustrated in FIGS. 9A and 9B, the trap filter 208 is constructed of two resonance circuits of the open stub type arranged in series. A first resonance circuit 208A includes one region of the power supply wiring 110 formed of the surface-layer wiring, an open stub pattern 222 formed of the first inner-layer wiring located below the one region, and a via hole 224 that connects the open stub pattern 222 and the power supply wiring 110. A second resonance circuit 208B includes one region of the power supply wiring 110 formed of the surface-layer wiring, an open stub pattern 223 formed of the first inner-layer wiring located below the one region, and a via hole 225 that connects the open stub pattern 223 and the power supply wiring 110. The power supply pad 120 is connected to the power supply terminal 106 of the driver IC 103. The pads 121 connect adjacent IC terminals. Further provided are the ground wiring layers 126 and 127, the solder resists 128 and 129, and the dielectric layers 130A to 130F. Here, the center frequency of the trap filter 208 is set to the vicinity of 21.5 GHz, which is the clock signal frequency. Hereinafter, description is made of a specific example of the structure.

First, the dielectric layers 130A to 130F may have the same structures as those of the first embodiment. In addition, shapes of the open stub patterns 222 and 223 are both set to a rectangle, and sizes thereof are set to be different from each other. As an example, a width W4 of the open stub pattern 222 and a width W5 of the open stub pattern 223 are both set to 1.0 mm, and set to be larger than the width of the power supply wiring. The open stub pattern 222 is formed to have a length L4 of 2.15 mm, while the open stub pattern 223 is formed to have a length L5 of 2.25 mm. The via holes 224 and 225 are formed by performing copper plating on laser holes. The via holes 224 and 225 are each formed to have a diameter of 0.2 mm. The first resonance circuit 208A and the second resonance circuit 208B are formed to have an inter-electrode interval S4 of 0.75 mm such that an interval (via pitch) P4 between central positions of the via holes 224 and 225 is, for example, 2.25 mm. The via pitch 24 is selected so as to be 90°, that is, ¼ a wavelength at the frequency of 21.5 GHz in terms of the electrical length of the power supply wiring 110. The above-mentioned structures of the printed circuit board and the trap filter are a mere example, and other structure may be used.

By forming the open stub patterns 222 and 223 to have the rectangular shapes and the widths larger than the width of the power supply wiring, it is possible to inhibit the characteristics of the resonance circuits from fluctuating due to the deviation of the pattern of the first inner-layer wiring from the surface-layer wiring.

Figure 10A:
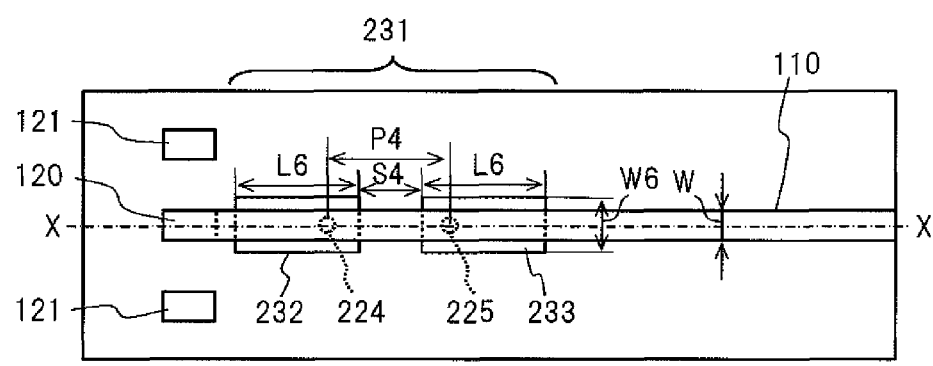
FIG. 10A is a plan view of a substrate in which a trap filter according to a fifth embodiment of the present invention is formed.
Figure 10B:
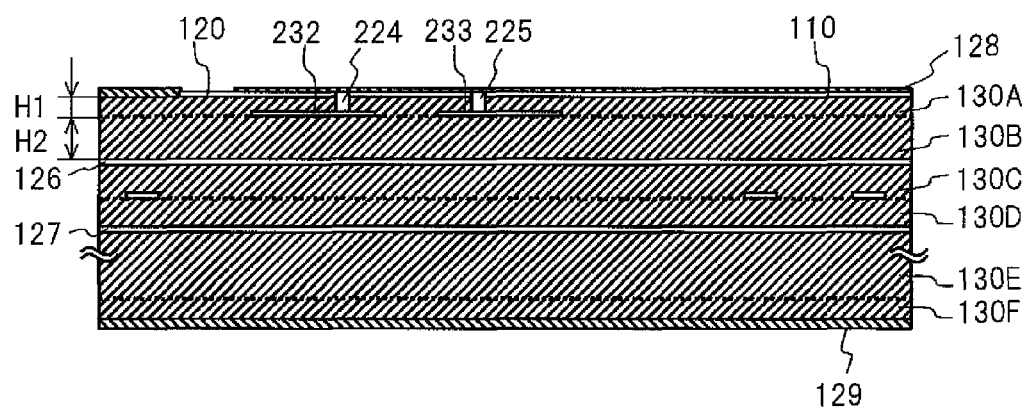
FIG. 10B is a sectional view of the substrate in which the trap filter according to the fifth embodiment is formed.

Next, FIGS. 10A and 10B are structural diagrams illustrating a trap filter 231 according to the fifth embodiment. FIG. 10A illustrates a part of the substrate 101 in which the trap filter 231 is formed, which is viewed from above, and FIG. 10B is a cross-sectional view thereof along the line X-X of FIG. 10A. As illustrated in FIGS. 10A and 10B, the trap filter 231 according to the fifth embodiment and the trap filter 131 according to the fourth embodiment differ in that the trap filter 231 is constructed by using two resonance circuits having the same shape, that is, having the same resonance frequency in the fifth embodiment. In FIGS. 10A and 10B, the open stub patterns 232 and 233 are set to have a width W6 of 1.0 mm and a length L6 of 2.15 mm.

Figure 11:
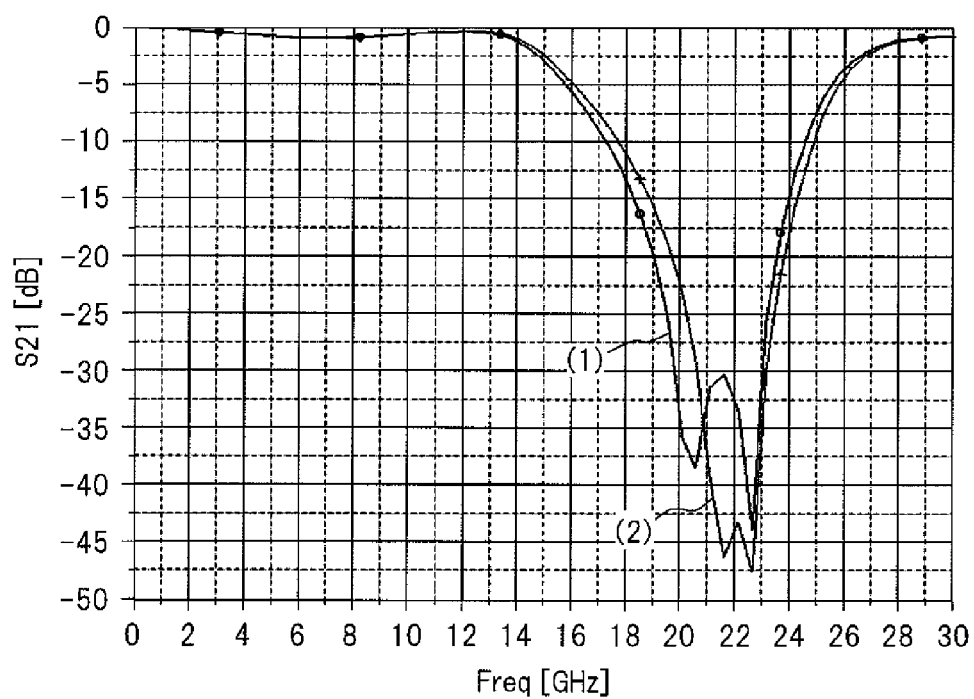
FIG. 11 is a graph illustrating small signal filter characteristics (S21) of the trap filters.

Next, by referring to FIG. 11, description is made of small signal filter characteristics (S21) of the trap filters according to the fourth and fifth embodiments. The small signal filter characteristics of the respective trap filters illustrated in FIG. are results obtained by using the three-dimensional electromagnetic field analysis tool in the case where 50-Ω ports are located at both ends of the power supply wiring 110 provided with the trap filter.

As illustrated in FIG. 11, the trap filter 208 according to the fourth embodiment is given a difference between the sizes of the two resonance circuits to obtain the small signal filter characteristic (indicated by the line (1)) exhibiting two valleys at 21.5 GHz and 22.7 GHz, and the center frequency is approximately 22 GHz. A trap band thereof corresponds to a domain ranging from the frequency of 19.8 GHz to the frequency of 23.1 GHz if defined as a domain of an attenuation of equal to or larger than 30 dB, which may realize a bandwidth of 3.3 GHz.

Next, as illustrated in FIG. 11, the trap filter 231 according to the fifth embodiment has the small signal filter characteristic (indicated by the line (2)) exhibiting a valley at the center frequency of 22 GHz. A trap band thereof corresponds to a domain ranging from the frequency of 20.6 GHz to the frequency of 23.2 GHz if defined as the domain of the attenuation of equal to or larger than 30 dB, which may realize a bandwidth of as large as 2.6 GHz but not so large as the value of the fourth embodiment, still being a relatively large value.

Figure 12:
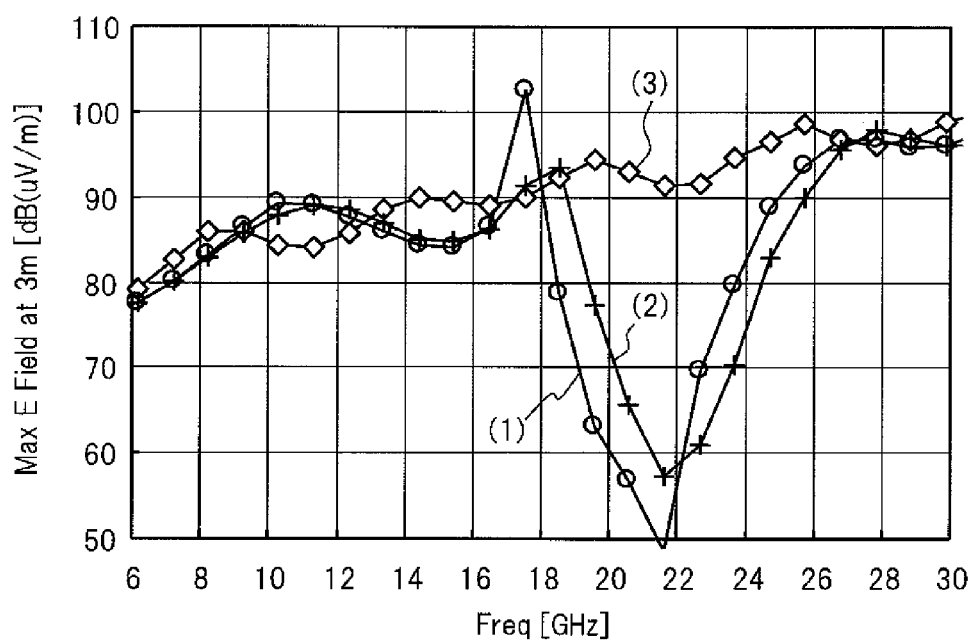
FIG. 12 is a graph representing relationships between the frequencies and the maximum electric field intensities of the unintentional electromagnetic wave.

Next, by referring to FIGS. 12 and 13, description is made of effects of reducing an unintentional electromagnetic wave by using the trap filters according to the fourth and fifth embodiments. The graphs illustrated in FIGS. 12 and 13 are simulation results by using the three-dimensional electromagnetic field analysis tool, and simulations are performed on the printed circuit board 10 illustrated in FIG. 1 for the sake of simplicity by assuming one of the driver output terminals 117 to be the only noise source and assuming the power supply wiring 110 to have the shape extending out of the shield plate 104 by a length of 10 mm with no further portion existing. The excitation source is located in the position of the driver output terminal 117, and has the excitation current value set to 10 mA at all of the frequencies.

In FIG. 12, the line (1) represents the fourth embodiment, the line (2) represents the fifth embodiment, and the line (3) represents the conventional technology provided with no trap filter. As illustrated in FIG. 12, in the fourth embodiment, the maximum electric field intensity of the unintentional electromagnetic wave is successfully reduced to equal to or smaller than 70 dB (μV/m) in a frequency range from the frequency of 19.0 GHz to the frequency of 22.7 GHz. In other words, in comparison with the conventional technology provided with no trap filter, the fourth embodiment produces the effect of such a great improvement that the unintentional electromagnetic wave is cut by equal to or larger than 20 dB in the domain of a frequency bandwidth of 3.7 GHz including the clock signal frequency of 21.5 GHz. In addition, in the case of the fourth embodiment, the highest effect of reducing the unintentional electromagnetic wave is obtained at 21.5 GHz, which is a frequency slightly lower than the center frequency of 22 GHz of the trap filter 208, and the maximum reduction effect of 42 dB is obtained.

Further, as illustrated in FIG. 12, in the fifth embodiment, the maximum electric field intensity of the unintentional electromagnetic wave is successfully reduced to equal to or smaller than 70 dB (μV/m) in a frequency range from the frequency of 20.2 GHz to the frequency of 23.6 GHz. In other words, in comparison with the conventional technology provided with no trap filter, the fifth embodiment produces the effect of such a great improvement that the unintentional electromagnetic wave is cut by equal to or larger than 20 dB in the domain of a frequency bandwidth of 3.4 GHz including the clock signal frequency of 21.5 GHz.

The impedance at a tip of the power supply wiring 110 may vary from 0Ω (short: short-circuited) to infinity (open: open-circuited) depending on a circuit layout or a frequency, and the unintentional electromagnetic wave needs to be reduced in all of the cases. Therefore, FIG. 13 illustrates changes of the unintentional electromagnetic wave intensities in a case where a tip impedance of the power supply wiring 110 is caused to change at the frequency of 21.5 GHz which is a clock frequency. In FIG. 13, the line (1) represents the fourth embodiment, the line (2) represents the fifth embodiment, and the line (3) represents the conventional technology provided with no trap filter.

As illustrated in FIG. 13, with a printed circuit board in which the trap filters according to the fourth embodiment and the fifth embodiment are provided to the power supply wiring, it is possible to realize a high value of the effect of reducing the unintentional electromagnetic wave, which is equal to or larger than 26 dB.

Note that in the above-mentioned embodiments, the multiplexer IC 102 having a clock outputting function is used but may be replaced by a clock generator IC. In addition, the driver IC 103 is used but may be replaced by a phase shifter IC that receives an input of a clock signal and controls a phase thereof.

Further, the above-mentioned embodiments are described by taking the example in which the present invention is applied to the optical transmitter/receiver device of an RZ-DQPSK system that operates at a bit rate of 43 Gbit/s. Alternatively, by including such a characteristic that the unintentional electromagnetic wave may be reduced by equal to or larger than 20 dB in a relatively wide frequency bandwidth, the present invention may be applied to the optical transmitter/receiver device of the RZ-DQPSK system that operates at dual rates of bit rates of 43 Gbit/s and 44.6 Gbit/s. The clock signal frequencies are 21.5 GHz and 22.3 GHz, respectively, both of which may be covered sufficiently in the above-mentioned embodiments by modifying the design so as to slightly increase the center frequency of the trap filter. This allows the reduction of the unintentional electromagnetic wave to be compatible with the reduced cost, and enables realizing the optical transmitter/receiver device that operates at the dual rates of 43 Gbit/s and 44.6 Gbit/s, which conforms to both the Synchronous Optical Network/Synchronous Digital Hierarchy (SONET/SDH) system and the Gigabit Ethernet (registered trademark) system only by one device.

Further in the above-mentioned embodiments, the description is made on the assumption that the present invention is applied to the optical transmitter/receiver device such as an optical transceiver module that conforms to, for example, the 300-pin MSA standard. Alternatively, the present invention may be applied to an optical transmission device inside which a transmitting circuit and a receiving circuit are packaged instead of providing the optical transmitter/receiver device as a module. In that case, it is unnecessary to provide a casing that covers the optical transmission device with a robust shield function against an electromagnetic leakage, and it is possible to reduce a device cost.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A printed circuit board, comprising:
   a substrate;
   a signal output circuit formed on the substrate, for outputting a clock signal;
   a shield for covering the signal output circuit;
   a power supply wiring for connecting the signal output circuit and a power source; and
   a trap filter provided to the power supply wiring, for attenuating a frequency component corresponding to a frequency of the clock signal;
   wherein the trap filter is provided inside the shield; and
   wherein the trap filter comprises a resonance circuit including:
   one portion of the power supply wiring;
   an inner-layer wiring of the substrate located below the one portion of the power supply wiring;
   an inner-layer ground wiring of the substrate located below the inner-layer wiring; and
   a via hole for connecting the inner-layer wiring and the inner-layer ground wiring.

2. The printed circuit board according to claim 1, wherein a plurality of the trap filters are provided to the power supply wiring.

3. The printed circuit board according to claim 2, wherein the plurality of the trap filters have a distance between centers of respective via holes thereof set to equal to or less than ¼a wavelength of the clock signal.

4. The printed circuit board according to claim 2, wherein the plurality of the trap filters have a distance between centers of respective via holes thereof set to equal to or less than 3 mm.

5. The printed circuit board according to claim 2, wherein the plurality of the trap filters have mutually different frequency components to be attenuated.

6. The printed circuit board according to claim 1, wherein:
   the signal output circuit comprises:
      an oscillator circuit for oscillating a clock signal; and
      an amplifier circuit for amplifying the clock signal oscillated by the oscillator circuit; and
   the trap filter is provided to the power supply wiring for each of the oscillator circuit and the amplifier circuit.

7. The printed circuit board according to claim 1, further comprising a capacitor provided to the power supply wiring.

8. An optical transmission device, comprising the printed circuit board according to claim 1.

9. A printed circuit board, comprising:
   a substrate;
   a signal output circuit formed on the substrate, for outputting a clock signal;
   a shield for covering the signal output circuit;
   a power supply wiring for connecting the signal output circuit and a power source; and a trap filter provided to the power supply wiring, for attenuating a frequency component corresponding to a frequency of the clock signal;

wherein the trap filter is provided inside the shield; and wherein the trap filter comprises a resonance circuit including:

one portion of the power supply wiring;

an inner-layer wiring of the substrate located below the one portion of the power supply wiring;

an inner-layer ground wiring of the substrate located below the inner-layer wiring; and a via hole for connecting the one portion of the power supply wiring and the inner-layer wiring.

* * * * *